United States Patent
Miao et al.

(10) Patent No.: US 7,859,340 B2
(45) Date of Patent: Dec. 28, 2010

(54) METAL-OXIDE-SEMICONDUCTOR CIRCUIT DESIGNS AND METHODS FOR OPERATING SAME

(75) Inventors: Guoqing Miao, San Diego, CA (US); Seyfollah Bazarjani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 20 days.

(21) Appl. No.: 12/056,137

(22) Filed: Mar. 26, 2008

(65) Prior Publication Data

US 2008/0252376 A1 Oct. 16, 2008

Related U.S. Application Data

(60) Provisional application No. 60/909,409, filed on Mar. 30, 2007.

(51) Int. Cl.
*H02H 7/20* (2006.01)
(52) U.S. Cl. .................... 330/298; 330/311; 330/253
(58) Field of Classification Search .............. 330/298, 330/311, 253
See application file for complete search history.

(56) References Cited

U.S. PATENT DOCUMENTS

| | | | | |
|---|---|---|---|---|
| 6,011,419 | A * | 1/2000 | Nowak et al. | 327/310 |
| 6,714,076 | B1 | 3/2004 | Kalb | |
| 6,911,871 | B1 | 6/2005 | Li et al. | |
| 6,998,902 | B2 * | 2/2006 | Sugimura | 327/539 |
| 7,102,410 | B2 * | 9/2006 | Khan et al. | 327/333 |
| 7,196,571 | B2 * | 3/2007 | Sumita | 327/534 |
| 7,215,171 | B2 * | 5/2007 | Kocaman et al. | 327/307 |
| 7,272,053 | B2 * | 9/2007 | Choy | 365/185.29 |
| 2005/0174171 | A1 | 8/2005 | Oswal et al. | |
| 2006/0255852 | A1 | 11/2006 | O'Donnell et al. | |

OTHER PUBLICATIONS

International Search Report—PCT/US08/058527—International Search Authority, European Patent Office—Oct. 7, 2008.
Written Opinion—PCT/US08/058527—International Search Authority, European Patent Office—Oct. 7, 2008.
Gentinne B., et al., "Improvement of the performances of SOI CMOS operational amplifiers by means of a gain-boosting stage," Proceedings of the International SOI Conference. Palm Springs, Oct. 5 19931005; 19931005-19931007, New York, IEEE, Conf. 19, Oct. 5, 1993, pp. 184-185.
Wyszynski A., et al., "VHF highly linear fully-balanced CMOS OTA," Proceedings of the International Symposium on Circuits and Systems. Chicago, May 3-6, 1993, New York, IEEE, May 3, 1993, pp. 1156-1159.
Minot S., et al., "BiCMOS OTA for high Q very high frequency continuous-time bandpass filters," Circuits and Systems, 1998. ISCAS '98. Proceedings of the 1998 IEEE International Symposium on Monterey, CA, May 31-Jun. 3, 1998, New York, IEEE, vol. 1, May 31, 1998, pp. 61-64.

* cited by examiner

*Primary Examiner*—Patricia Nguyen
(74) *Attorney, Agent, or Firm*—Jiayu Xu

(57) ABSTRACT

Complimentary Metal-Oxide-Semiconductor (CMOS) circuits made with core transistors are capable of reliable operation from an IO power supply with voltage that exceeds the reliability limit of the transistors. In embodiments, biasing of an operational amplifier is changed in part to a fixed voltage corresponding to the reliability limit. In embodiments, switched capacitor networks are made with one or more amplifiers and switches including core transistors, but without exposing the core transistors to voltages in excess of their reliability limit. In embodiments, operational transconductance amplifiers (OTAs) include core transistors and operate from IO power supplies. Level shifters for shifting the levels of a power down signal may be used to avoid excessive voltage stress of the OTAs' core transistors during turn-off. Non-level shifting means may be used to clamp output voltages and selected internal voltages of the OTAs, also avoiding excessive voltage stress of the core transistors during turn-off.

18 Claims, 13 Drawing Sheets

METAL-OXIDE-SEMICONDUCTOR CIRCUIT DESIGNS AND METHODS FOR OPERATING SAME

CLAIM OF PRIORITY UNDER 35 U.S.C §119

The present application for patent claims priority to U.S. Provisional Application No. 60/909,409, entitled "Low power, high voltage switched capacitor circuits in nanometer CMOS technologies," filed Mar. 30, 2007, which is assigned to the assignee hereof and expressly incorporated herein by reference.

BACKGROUND

1. Field

Apparatus and methods described in this document relate to electronic circuit designs. More particularly, the apparatus and methods relate to Metal-Oxide-Semiconductor circuits, and to methods for powering down such circuits.

2. Background

Many active filters, analog-to-digital converters (ADCs), and other circuits fabricated with Complimentary Metal-Oxide-Semiconductor (CMOS) devices are designed and implemented using switched capacitor techniques. CMOS switched capacitor circuits may employ CMOS transistors and capacitors.

Higher levels of system integration are desired in many electronic systems, including cellular telephones, because integration offers lower production costs and allows more functions to be packed into smaller footprints and volumes. Modern cellular telephones feature functions such as games, video, and music, in addition to wireless telephony. These and other functions may be implemented using mixed analog/digital circuits in CMOS fabrication technologies.

The needs for high levels of integration, lower costs, and higher speeds are driving CMOS technology deeper into nanometer scale. At this time, CMOS devices may be fabricated using 65 nm and even smaller feature-size devices. The scale of CMOS devices is likely to continue to decrease in the future.

As transistor dimensions shrink down to nanometer scales, power supply voltage is generally also reduced in order to keep the electric field strength constant and ensure lifetime device reliability. In the case of 65 nm devices, their power supply voltage may be brought down to 1.1 volts and possibly lower. The reason for low supply voltages is that as CMOS technology advances to finer (or thinner) scales/geometries, transistor breakdown voltages are reduced. At the same time, certain design blocks typically use higher power supply voltages, which may be about 2.1 volts or 3.3 volts. Such blocks may include high-speed universal serial bus (USB) and audio coder-decoder (CODEC) blocks. The minimum supply voltage of a CODEC may be determined by the audio power that is delivered to the speakers, or by maximum input signal voltage that is processed by the CODEC. The minimum supply voltage of a USB interface block may be dictated by the applicable USB specification. Thus, selection of power supply voltages for USB, CODEC, and other blocks may be driven by external considerations.

It may be desirable for a single semiconductor chip to have two different types (scales, geometries, or sizes) of CMOS transistors, with one type adapted for operation at a low supply voltage and another type adapted for a higher supply voltage. The low supply voltage transistors, referred to herein as core transistors, have a relatively thin gate oxide layer to increase speed at low voltage. These transistors may be in the central part of the chip and may be optimized with the current state of process engineering for packing density and high performance. The high supply voltage transistors are usually used to interface with external devices/chips and are hence referred to as the input/output (I/O or IO) transistors. These transistors are larger than core transistors, and have a relatively thick gate oxide layer for reliable high voltage operation.

Because of the integration, cost, and speed constraints, there is a need in the art to provide CMOS circuits fabricated at relatively small scales, but that use relatively high power supply voltages. There is also a need in the art for operating such circuits with the relatively high power supply voltages without overstressing the individual devices of the circuits. Furthermore, there is a need in the art for combining two different types of CMOS devices on a single chip, with one type adapted for operation at a relatively low supply voltage, and another type adapted for operation at a relatively high supply voltage.

SUMMARY

Embodiments disclosed herein may address one or more of the above stated needs by describing various design methods to enable (1) operation of low-voltage thin-oxide transistors from a high voltage supply; (2) operation of a combination of low-voltage thin-oxide transistors and high-voltage thick-oxide transistors in a switched capacitor circuit using a high voltage supply or dual supplies; and (3) replacement of some high power supply voltage thick-oxide transistors with low power supply voltage thin-oxide transistors. (This list may be incomplete.) Low-voltage high-speed core transistor performance and size benefits may thus be realized while maintaining the benefits of high-voltage IO thick-oxide transistors.

In an embodiment, an operational amplifier includes (1) a ground rail, (2) a first supply rail configured to connect to a first power supply providing a first supply voltage between the first supply rail and the ground rail, (3) a second supply rail configured to connect to a second power supply providing a second supply voltage between the second supply rail and the ground rail, the second supply voltage being less than the first supply voltage, and (4) a plurality of metal-oxide-semiconductor transistors fabricated to a reliability voltage limit less than the first supply voltage. The plurality of transistors includes a first P-channel transistor, a second P-channel transistor, a third P-channel transistor, a fourth P-channel transistor, a first N-channel transistor, a second N-channel transistor, a third N-channel transistor, and a fourth N-channel transistor. Each transistor of the plurality of transistors has a source, a drain and a gate. The source of the first P-channel transistor is coupled to the first supply rail, the drain of the first P-channel transistor is coupled to the source of the second P-channel transistor, the drain of the second P-channel transistor is coupled to the drain of the drain of the first N-channel transistor, the source of the first N-channel transistor is coupled to the drain of the second N-channel transistor, and the source of the second N-channel transistor is coupled to the ground rail. The source of the third P-channel transistor is coupled to the first supply rail, the drain of the third P-channel transistor is coupled to the source of the fourth P-channel transistor, the drain of the fourth P-channel transistor is coupled to the drain of the third N-channel transistor, the source of the third N-channel transistor is coupled to the drain of the fourth N-channel transistor, and the source of the fourth N-channel transistor is coupled to the ground rail. The gates of the second P-channel transistor, the fourth P-channel transistor, the first N-channel transistor, and the third N-channel transistor are coupled to the second supply rail.

In an embodiment, a switched capacitor network includes (1) a common mode rail, (2) a first supply rail configured to connect to a first power supply providing a first predetermined supply voltage between the first supply rail and the common mode rail, (3) a first operational transconductance amplifier (OTA) having a first non-inverting input, a first inverting input, and a first output, (4) a plurality of switches, and (5) a sampling capacitor with a first sampling capacitor terminal and a second sampling capacitor terminal. Each switch of the plurality of switches is made of a complimentary NMOS/PMOS transistor pair, with each transistor of said each switch fabricated to a predetermined reliability voltage limit. The first OTA is connected to the first supply rail and the common mode rail to obtain operational power from the first power supply. The predetermined reliability voltage limit is less than the first predetermined supply voltage.

In an embodiment, a switched capacitor network includes (1) a ground rail, (2) a supply rail configured to connect to a power supply providing a predetermined supply voltage between the supply rail and the ground rail, (3) a first operational transconductance amplifier (OTA) with a first non-inverting input, a first inverting input, and a first output, the first OTA being connected to the supply rail and the ground rail to obtain operational power from the power supply, (4) a sampling capacitor, and (5) a plurality of switches. The plurality of switches includes a plurality of single transistor switches and a first switch comprising a complimentary NMOS/PMOS transistor pair, each transistor of each switch being fabricated to a reliability voltage limit. The reliability voltage limit is less than the predetermined supply voltage.

In embodiments, an operational transconductance amplifier includes (1) a ground rail, (2) a first supply rail configured to connect to a first power supply configured to provide a predetermined supply voltage between the supply rail and the ground rail, (3) a first plurality of metal-oxide-semiconductor transistors fabricated to a reliability voltage limit less than the predetermined supply voltage, (4) a second plurality of metal-oxide-semiconductor transistors fabricated to a reliability voltage limit less than the predetermined supply voltage, the second plurality of transistors being interposed between the first plurality of transistors and the ground rail, the second plurality of transistors being configured to selectively connect and disconnect the first plurality of transistors from the ground rail in response to a first power down signal, the first power down signal varying between a first low voltage level and a first high voltage level, (5) a level shifting circuit configured to generate a second power down signal from the first power down signal, the second power down signal being at a second low voltage level in response to the first power down signal being at the first high voltage level, the second power down signal being at a second low voltage level in response to the first power down signal being at the first high voltage level, the second high voltage level being different from the first high voltage level, the second low voltage level being different from the first low voltage level, and (6) a third plurality of metal-oxide-semiconductor transistors fabricated to a reliability voltage limit less than the predetermined supply voltage, the third plurality of transistors being interposed between the first plurality of transistors and the supply rail, the third plurality of transistors being configured to selectively connect and disconnect the first plurality of transistors from the supply rail in response to the second power down signal. The first plurality of transistors is disconnected from the supply rail and the ground rail in response to the first power down signal being at the first low voltage level.

In an embodiment, an operational transconductance amplifier includes (1) a ground rail, (2) a first supply rail configured to connect to a first power supply providing a predetermined supply voltage between the supply rail and the ground rail, (3) a first plurality of metal-oxide-semiconductor transistors fabricated to a reliability voltage limit less than the predetermined supply voltage, means for selectively connecting and disconnecting the first plurality of transistors from the ground rail in response to a first power down signal, the first power down signal varying between a first low voltage level and a first high voltage level, (4) means for connecting and disconnecting the first plurality of transistors from the supply rail in response to a second power down signal, and (5) means for generating the second power down signal from the first power down signal, the second power down signal being at a second low voltage level in response to the first power down signal being at the first high voltage level, the second power down signal being at a second low voltage level in response to the first power down signal being at the first high voltage level, the second high voltage level being different from the first high voltage level, the second low voltage level being different from the first low voltage level.

In an embodiment, an operational transconductance amplifier includes (1) a ground rail, (2) a first supply rail configured to connect to a first power supply providing a predetermined supply voltage between the supply rail and the ground rail, (3) a first plurality of metal-oxide-semiconductor transistors fabricated to a reliability voltage limit less than the predetermined supply voltage, and (4) a non-level shifting means for preventing voltage stress in excess of the reliability voltage for each transistor of the first plurality of transistors during turn-off. Excessive voltage stress is prevented by clamping (pulling) the outputs and certain internal points to a voltage equal to the reliability limit.

In an embodiment, an operational transconductance amplifier includes a ground rail, a first supply rail configured to connect to a first power supply providing a first predetermined supply voltage between the first supply rail and the ground rail, a second supply rail configured to connect to a second power supply providing a second predetermined supply voltage between the second supply rail and the ground rail, and a plurality of metal-oxide-semiconductor transistors fabricated to a reliability voltage limit less than the first predetermined supply voltage. The reliability limit is about the second predetermined supply voltage. The plurality of transistors includes a first through thirteenth P-channel transistors, and first through fifteenth N-channel transistor. The connections are as follows:

(1) the sources of the first, second, fourth, sixth, and seventh P-channel transistors are coupled to the first supply rail;

(2) the sources of the eleventh, twelfth, thirteenth, fourteenth, and fifteenth N-channel transistors are coupled to the ground rail;

(3) each gate of the eleventh, twelfth, thirteenth, fourteenth, and fifteenth N-channel transistors is configured to receive a first power down signal; and (4) the drain of the seventh P-channel transistor is coupled to the source of the ninth P-channel transistor, the drain of the ninth P-channel transistor is coupled to the drain of the ninth N-channel transistor and to the drain of the thirteenth P-channel transistor, the source of the ninth N-channel transistor is coupled to the drain of the seventh N-channel transistor, the source of the seventh N-channel transistor is coupled to the drain of the fifth N-channel transistor and to the source of the sixth N-channel transistor, the source of the fifth N-channel transistor is coupled to the drain of the fifteenth N-channel transistor, the drain of the sixth P-channel transistor is coupled to the source of the eighth P-channel transistor, the drain of the eighth P-channel transistor is coupled to the drain of the eighth N-channel transistor and to the drain of the twelfth P-channel transistor, the source of the eighth N-channel transistor is coupled to the drain of the sixth N-channel transistor, the source of the twelfth P-channel transistor is coupled to the source of the thirteenth P-channel transistor and to the second supply rail, the gate of the twelfth P-channel transistor is coupled to the gate of the thirteenth P-channel transistor, the gate of the ninth N-channel transistor is coupled to the gate of the eighth N-channel transistor and to the gate of the tenth N-channel transistor, the drain of the fourth P-channel transistor is coupled to the source of the fifth P-channel transistor, the drain of the fifth P-channel transistor is coupled to the drain of the tenth N-channel transistor and to the drain of the eleventh P-channel transistor, the drain of the tenth N-channel transistor is coupled to the gate of the tenth N-channel transistor, the source of the tenth N-channel transistor is coupled to the drain of the fourth N-channel transistor and to the source of the sixth N-channel transistor, the source of the fourth N-channel transistor is coupled to the drain of the fourteenth N-channel transistor, the drain of the second P-channel transistor is coupled to the source of the third P-channel transistor, the drain of the third P-channel transistor is coupled to the gate of the second P-channel transistor and to the drain of the third N-channel transistor, the source of the third N-channel transistor is coupled to the drain of the thirteenth N-channel transistor, the gate of the first P-channel transistor is coupled to the drain of the first P-channel transistor and to the gate of the third P-channel transistor, the gate of the third P-channel transistor is coupled to the gate of the fifth P-channel transistor and to the gate of the eighth P-channel transistor, the gate of the eighth P-channel transistor is coupled to the gate of the ninth P-channel transistor, the gate of the second P-channel transistor is coupled to the gate of the fourth P-channel transistor and to the gate of the sixth P-channel transistor, the gate of the sixth P-channel transistor is coupled to the gate of the seventh P-channel transistor, the drain of the first P-channel transistor is coupled to the drain of the second N-channel transistor, the source of the second N-channel transistor is coupled to the drain of the twelfth N-channel transistor, the gate of the first N-channel transistor is coupled to the gate of the second N-channel transistor and to the drain of the tenth P-channel transistor, the source of the first N-channel transistor is coupled to the drain of the eleventh N-channel transistor, the gate of the first N-channel transistor is coupled to the drain of the first N-channel transistor, the source of the tenth P-channel transistor is coupled to the second supply rail, the gate of the second N-channel transistor is coupled to the gate of the third N-channel transistor and to the gate of the fourth N-channel transistor, the gate of the fourth N-channel transistor is coupled to the gate of the fifth N-channel transistor, and the gates of the tenth P-channel transistor and the twelfth P-channel transistor are configured to receive a second power down signal.

The second power down signal is inverted first power down signal.

In an embodiment, an operational transconductance amplifier includes a ground rail, a first supply rail configured to connect to a first power supply providing a first predetermined supply voltage between the first supply rail and the ground rail, a second supply rail configured to connect to a second power supply providing a second predetermined supply voltage between the second supply rail and the ground rail, and a pair of output connections. The amplifier also includes a first plurality of transistors configured to provide amplification, each transistor of the first plurality of transistors being fabricated to a reliability limit less than the first predetermined supply voltage. The reliability limit is about the second predetermined supply voltage. The amplifier further includes a pair of transistors configured to pull each output connection of the pair of output connections to the second predetermined supply voltage during turn-off of the amplifier. The amplifier further includes a second plurality of transistors interposed between the first plurality of transistors and the ground rail. The third plurality of transistors is configured to selectively disconnect the first plurality of transistors from the supply rail during the turn-off.

In an embodiment, an operational transconductance amplifier includes a ground rail, a first supply rail configured to connect to a first power supply providing a predetermined supply voltage between the supply rail and the ground rail, and a first plurality of metal-oxide-semiconductor transistors fabricated to a predetermined reliability voltage limit. The limit is less than the predetermined supply voltage. The amplifier also includes a non-level shifting means for preventing voltage stress in excess of the predetermined reliability voltage limit for each transistor of the first plurality of transistors during turn-off.

In an embodiment, a method of operating an operational transconductance amplifier includes providing amplification and biasing core transistors fabricated to a predetermined reliability voltage limit. The method also includes providing a power supply voltage to the amplification and biasing core transistors, the power supply voltage exceeding the predetermined reliability voltage limit. The method further includes clamping outputs of the amplifier to a vddL voltage that does not exceed the predetermined reliability voltage limit; this step is performed during turn-off of the amplifier. The method further includes, during the turn-off, disconnecting the amplification and biasing core transistors from the ground.

In an embodiment, a method of operating an operational transconductance amplifier includes providing amplification and biasing core transistors fabricated to a predetermined reliability voltage limit. The method also includes providing a power supply voltage to the amplification and biasing core transistors; the power supply voltage exceeds the predetermined reliability limit. The method further includes receiving a first power down signal, and generating a second power down signal by inverting and level-shifting the first power down signal. The second power down signal varies between the predetermined reliability voltage limit and the power supply voltage. The method further includes using the first power down signal to electrically isolate the amplification and biasing core transistors from ground rail of the amplifier during power down, and using the second power down signal to electrically isolate the amplification and biasing core transistors from the power supply voltage during power down.

In an embodiment, a method of operating an operational amplifier includes providing amplification and biasing core transistors fabricated to a predetermined reliability voltage limit. The method also includes providing a power supply voltage to the amplification and biasing core transistors. The power supply voltage exceeds the predetermined reliability voltage limit. The method further includes providing a biasing voltage to gates of at least two of the amplification and biasing core transistors. The biasing voltage is such that it does not exceed the predetermined reliability voltage limit.

In an embodiment, an operational transconductance amplifier includes (1) a ground rail, (2) a first supply rail configured to connect to a first power supply providing a first supply voltage between the first supply rail and the ground rail, (3) a second supply rail configured to connect to a second power supply providing a second supply voltage between the second supply rail and the ground rail, the second supply voltage being less than the first supply voltage, (4) an input stage, and (5) an output stage coupled to the input stage. The output stage has a first side and a second side. The first side includes a first amplification transistor, a first bias transistor, and a first plurality of protection transistors. The second side includes a second amplification transistor, a second bias transistor, and a second plurality of protection transistors. Each transistor of the first amplification transistor, first bias transistor, first plurality of protection transistors, second amplification transistor, second bias transistor, and second plurality of protection transistors has a drain, a gate, and a source. The transistors of the first side are connected in series between the first supply rail and the ground rail, for example, as the transistors MP4, MP6, MN5, and MN3 shown in FIG. 2. The transistors of the second side are connected in series between the first supply rail and the ground rail, for example, as the transistors MP3, MP5, MN2, and MN4 shown in FIG. 2. The transistors of the first and second sides are fabricated to a reliability voltage limit less than the first supply voltage. The gates of the first and second pluralities of protection transistors are coupled to the second supply rail.

These and other embodiments and aspects of the present invention will be better understood with reference to the following description, drawings, and appended claims.

DETAILED DESCRIPTION

Figure 1:
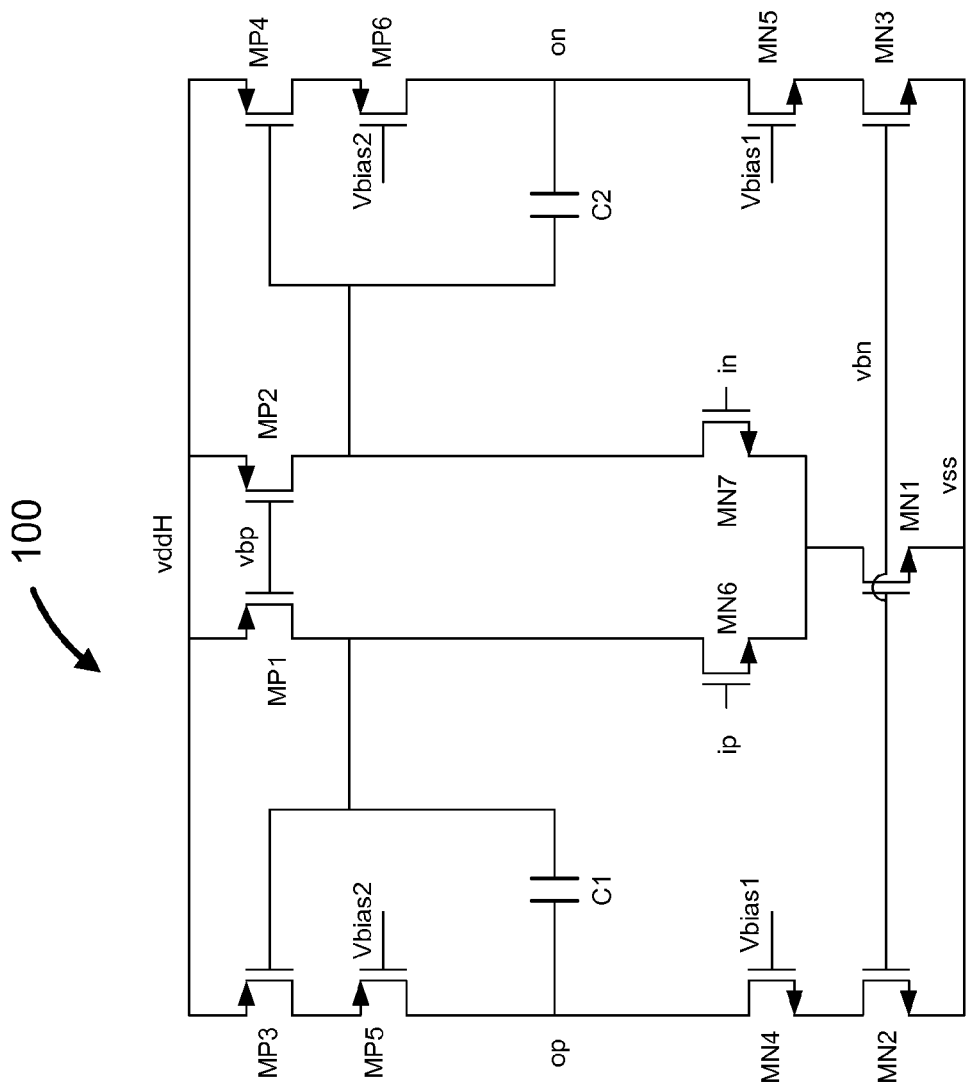
FIG. 1 shows selected elements of a simplified two stage operational amplifier.

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

An "operational transconductance amplifier" or "OTA" is an amplifier, buffer, or a similar arrangement of individual components in which an input voltage produces an output current; essentially, it is a voltage-controlled current source designed to provide substantially current-source (high impedance) output or outputs.

"Core" devices are semiconductor transistors and similar devices made with a gate oxide layer that is thin relative to the gate oxide layer of "IO" devices. The thin oxide layer of the core devices typically increases their speed compared to the speed of IO devices. Core devices typically use a supply voltage ("core supply voltage") that is low relative to the supply voltage of IO devices ("IO supply voltage"); the power supply voltage for IO devices my be two or three times as high as the core power supply voltage. The reliability voltage limit of a core device is substantially the core supply voltage; similarly, the reliability voltage limit of an IO device is substantially the IO supply voltage. Core transistors may reside in the central part of the chip and may be optimized with the current state of process engineering for packing density and high speed performance. The relatively thick oxide layer of IO devices allows operation with the relatively high IO supply voltage. For some embodiments and variants, the IO supply voltage is between 3.2 and 3.4 volts. For some embodiments and variants, the IO supply voltage is between 2.1 and 2.3 volts; and the core supply voltage is between 1.2 and 1.4 volts.

An access terminal, which also may be referred to as AT, subscriber station, user equipment, UE, mobile terminal, MT, or cellular communication device may be mobile or stationary, and may communicate with one or more base transceiver stations. An access terminal may be any of a number of types of devices, including but not limited to personal computer (PC) card, external or internal modem, wireless telephone, and personal digital assistant (PDA) with wireless communication capability. An access terminal transmits and receives data packets to or from a radio network controller through one or more base transceiver stations.

Base transceiver stations and base station controllers are parts of a network called radio network, RN, access network, or AN. A radio network may be a UTRAN or UMTS Terrestrial Radio Access Network. The radio network may transport data packets between multiple access terminals. The radio network may be further connected to additional networks outside the radio network, such as a corporate intranet, the Internet, a conventional public switched telephone network (PSTN), or another radio network, and may transport data and voice packets between each access terminal and such outside networks. Depending on conventions and on the specific implementations, a base transceiver station of a radio network may be referred to by other names, including Node-B, base station system (BSS), and simply base station. Similarly, a base station controller may be referred to by other names, including radio network controller, RNC, controller, mobile switching center, or serving GPRS support node.

The scope of this document extends to these and similar wireless communication system components using CMOS devices, as well as to other electronic equipment.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

CMOS technology scaling continues to follow Moore's Law and is now getting into ultra-deep submicron or nanometer (below 0.1 μm) range. Smaller feature size allows higher digital circuit density (or higher function per unit area) with lower power consumption. It also offers higher system speed because of availability of faster transistors. To ensure reliable operation of these miniature devices, operating supply voltage may need to be reduced. For instance, the recommended nominal supply voltage for 65 nm CMOS core devices may be 1.2 volts or thereabout (1.1 to 1.3 volts, for example).

Lower supply voltage is beneficial for digital circuits because, for example, digital dynamic power consumption generally follows a quadratic relationship to the supply voltage: $P \sim \alpha f C V_{DD}^2$. In this relationship, P is the power consumption, α is the activity factor, C is the total node capacitance, f is the operating frequency, and $V_{DD}$ stands for the supply voltage.

As briefly noted above, many analog, digital input/output (IO) interfaces, and other blocks use supply voltages higher than 1.1 volts. For example, high speed USB interfaces may need 3.3V supply voltage; Double Data Rate 1 (DDR-1) IOs may need 2.5V supply voltage; and Double Data Rate 2 (DDR-2) IOs may operate at 1.8V supply voltage.

Cell telephone applications, for example, may specify 50 mW of maximum power to be delivered into a 32Ω earphone speaker, and about 500 mW to be delivered into an 8Ω loudspeaker. Thus, earphone power amplifier should be able to accommodate a differential peak to peak signal swing of about 3.58 volts. For moderate linearity of 40 dB and considering 150 mV of saturation voltage across two output devices in such an amplifier, a supply voltage of 2.1 volts may be needed for proper operation. For class D or class AB loudspeaker driver, the maximum differential signal swing across the load is about 5.65 volts. For moderate linearity a supply voltage of 3.1 volts may be needed. For high linearity (60 dB and above), a supply voltage of 3.3V may be needed (allowing 250 mV saturation voltage across output devices).

In general, a relatively high supply voltage is preferred in most analog circuits due to availability of higher signal swing. At higher supply voltages, power-, area-, and noise-efficient telescopic amplifier is functional and provides satisfactory output signal swing for many applications. At relatively low power supply voltages, a multi-stage amplifier may instead be needed to achieve sufficient DC gain. Multi-stage amplifiers may require large compensation capacitors for stability, they may consume more current, and generally they may be noisier than a single-stage telescopic amplifier.

Higher supply voltages may also be desirable for analog circuits because they yield lower power consumption in noise limited circuits. Derivation demonstrating this phenomenon follows.

Opamp power dissipation in driving a load capacitor is given by this equation:

$$P = V_{DD} I_D. \tag{1}$$

The speed of analog circuits is determined by unity gain bandwidth of the opamp, which is given by equation 2:

$$\omega_u = \frac{g_m}{C}. \tag{2}$$

The equation for dynamic range is this:

$$DR = \frac{V_{i,rms}^2}{kT/C} \propto \frac{V_{DD}^2 C}{kT}. \tag{3}$$

Finally, $g_m$ can be expressed as follows:

$$g_m = \frac{I_D}{nkT/q}. \tag{4}$$

From a combination of the above equations, power dissipation can be expressed in terms of dynamic range, speed, and supply voltage, in this way:

$$P \propto DR kT \omega_u \left(\frac{kT/q}{V_{DD}}\right). \tag{5}$$

Thus, reducing the supply voltage, if accompanied by an increase in load capacitance to keep the dynamic range constant, may increase power consumption. Note that, in the above derivation, subthreshold operation was assumed for power efficiency.

Certain DC properties of nanometer scale devices may also be improved at higher supply voltages. We briefly demonstrate this in the following paragraphs.

Transconductance of transistors in subthreshold and strong inversion operating regimes are given by equation (4) above and equation (6) below, respectively:

$$g_m = \frac{2I_D}{V_{GS} - V_T} = \frac{2I_D}{V_{on}}. \tag{6}$$

Unity gain frequency of metal oxide semiconductor field effect transistors (MOSFETs) may be given by the following equation using a quadratic formula for drain current:

$$f_T \propto \frac{g_m}{2\pi C_{GS}} \propto \frac{V_{GS} - V_T}{L^2}. \tag{7}$$

Transistor unity gain therefore increases with CMOS downscaling. It follows that downscaling improves certain DC and AC operating characteristics, at least in some applications.

The main CMOS device failure mechanisms are Time Dependent Dielectric Breakdown (TDDB), Hot Carrier Injection (HCI), PMOSFET Negative Bias Threshold Instability (NBTI), and junction breakdown. We note that junction breakdown is not a major reliability concern for current nanometer scale devices, and then briefly describe below each of the other failure mechanisms.

TDDB, also known as gate oxide breakdown, is caused by excessive electric field across the gate oxide. When gate oxide is damaged, gate current is increased and the device is no longer controlled by the gate voltage.

HCI results from high energy carriers that are injected into the gate oxide. When carriers gain sufficient kinetic energy due to high drain-source electric filed, they cause impact ionization. Some electron-hole pairs generated by impact ionization can deflect towards gate oxide and get trapped there. This phenomenon causes a shift in threshold voltage of the device.

NBTI occurs when PMOS is stressed under a negative gate-to-source voltage, increasing threshold voltage and causing reduction in drain current and transconductance. NBTI's effect worsens at higher temperatures and shorter channel lengths. The effect of NBTI under dynamic condition, where gate bias is switched between high and low, shows that a longer lifetime is achieved compared to a static condition. NBTI may be a serious reliability concern for thin oxide PMOSFETs.

Table 1 shows various reliability voltages for 65 nm thin-oxide (core) and 0.25 µm thick-oxide (IO) transistors in a typical 65 nm current CMOS technology. As shown in Table 1, maximum allowed supply voltage for these core transistors may be 1.4V, which is determined by PMOS NBTI and NMOS/PMOS HCI lifetime reliability concerns.

TABLE 1

| TDDB | IO | NMOS | 3.8 V |
|------|------|------|-------|
|      |      | PMOS | 4.1 V |
|      | Core | NMOS | 1.7 V |
|      |      | PMOS | 1.7 V |
| HCI  | IO   | NMOS | 3.0 V |
|      |      | PMOS | 3.3 V |
|      | Core | NMOS | 1.4 V |
|      |      | PMOS | 1.4 V |
| NBTI | IO   | PMOS | 4.0 V |
|      | Core | PMOS | 1.4 V |

In summary, (1) supply voltages for analog circuits may be dictated by external interfaces, (2) relatively high supply voltages may be beneficial for device performance in nanometer technologies, and (3) relatively high supply voltages may lower power consumption.

A relatively high power supply (IO) voltage OTA can be implemented using relatively low power supply voltage core devices. In such an OTA, transistors may be stacked using cascode technique to ensure that no core device experiences high voltage between gate and drain, gate and source, or drain and source nodes.

FIG. 1 shows selected elements of a simplified two stage operational amplifier 100 with rail-to-rail output capability at its outputs op and on. In variants, the amplifier 100 may use only core devices, and may be powered by a 2.1 volt power supply (vddH). Transistors MN1, MN6, MN7, MP1, and MP2 form the first gain stage of the amplifier 100, with inputs ip and in; transistors MN2, MN3, MN4, MN5, MP3, MP4, MP5, and MP6 form the output stage; and C1 and C2 are Miller compensation capacitors. The amplifier 100 is fully differential. Not shown in FIG. 1 are the common mode feedback and the bias circuits for vbn and vbp voltages.

NMOS Transistors MN4 and MN5 are properly biased by voltage Vbias1, and PMOS transistors MP5 and MP6 are biased properly by voltage Vbias2. In this way, MN4, MN5, MP5, and MP6 are protected from voltage overstress. The output stage of the amplifier 100 can thus deliver rail-to-rail output without reliability problems from overstressing the core devices MN2-MN5 and MP3-MP6 with the high power supply voltage differential between vddH and vss.

Figure 2:
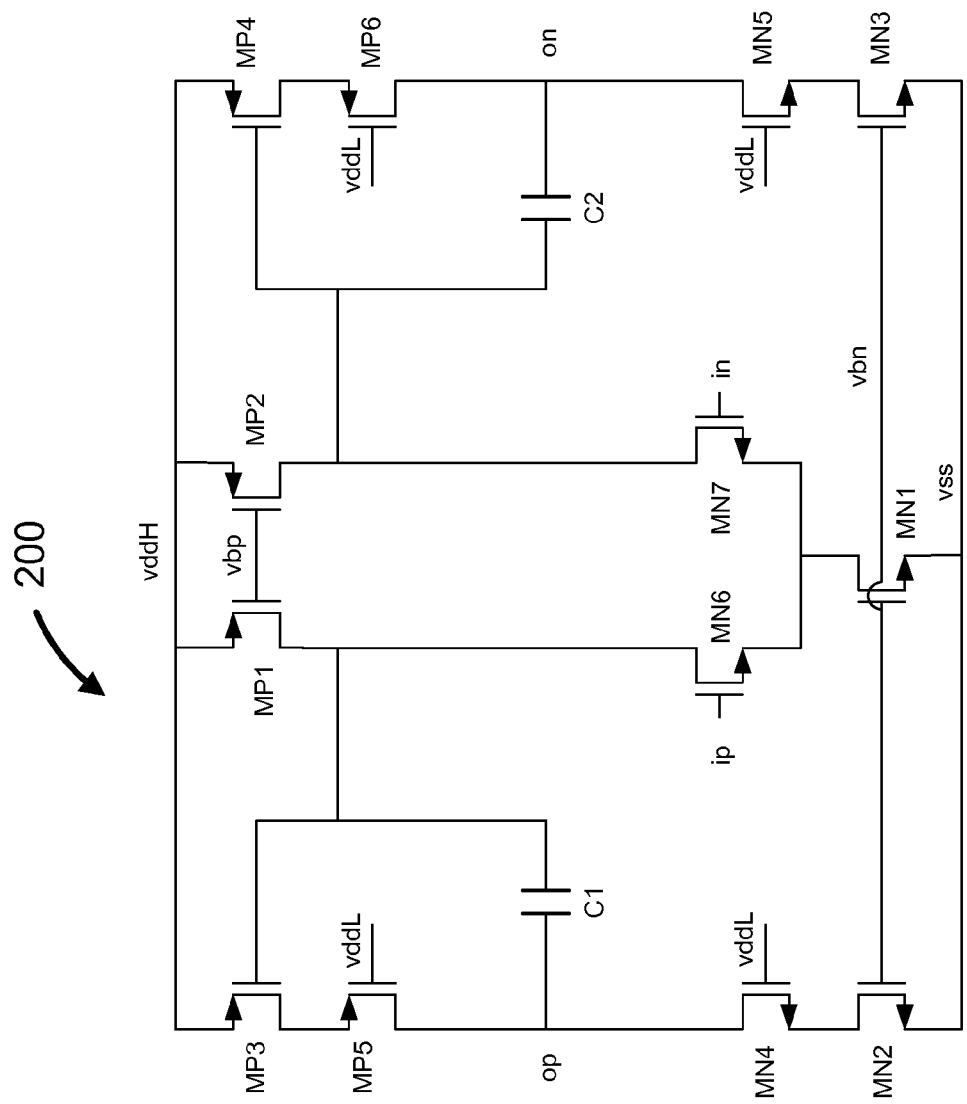
FIG. 2 shows selected elements of an operational transconductance amplifier.

FIG. 2 shows selected elements of an operational transconductance amplifier 200, which is similar to the amplifier 100. Here, however, the gates of transistors MN4, MN5, MP5, and MP6 are connected to the vddL power supply. The power supply voltages vddH and vddL are IO power supply voltage and core power supply voltage, respectively. The IO power supply vddH may be about 2.1 volts, while the core power supply vddL may be about 1.3 volts.

The MN4, MN5, MP5, and MP6 devices act as the protection devices for MN2, MN3, MP3, MP4, respectively. For example, when output voltage op moves up to the vddH rail (one vds less than the vddH level), MN4 shields MN2, preventing the drain-source and drain-gate potential drops of MN2 from exceeding their reliability limit. At the same time, MN4 is below its stress limit because its gate voltage is set at vddL. MP3 and MP5 are not stressed when the op output goes up to the vddH rail. On the other hand, when the op output voltage reaches the vss rail (one vds above vss), MN2 and MN4 are not stressed. MP5 now acts as the protection device, shielding MP3 from stress. Same protection scheme applies to the on output stage, where MN5 protects MN3, and MP6 protects MP4.

Figure 3:
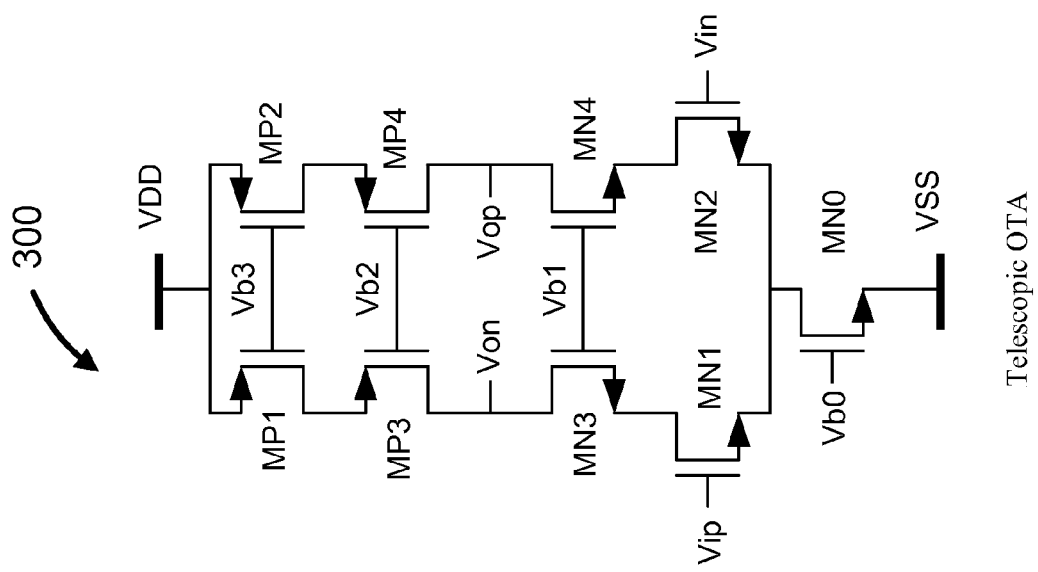
FIG. 3 shows selected elements of a telescopic amplifier.

If rail-to-rail output swing is not required, a telescopic amplifier, such as an amplifier 300 shown in FIG. 3, may be employed in switched capacitor (SC) and other blocks using a relatively high power supply voltage (e.g., IO power supply voltage). The telescopic amplifier 300 may be built with all core devices. As can be seen, the telescopic amplifier 300 has many cascode transistors, so using a relatively high supply voltage (for example, 2.1 volts or even higher) should not put the individual core devices under excessive voltage stress.

Figure 4:
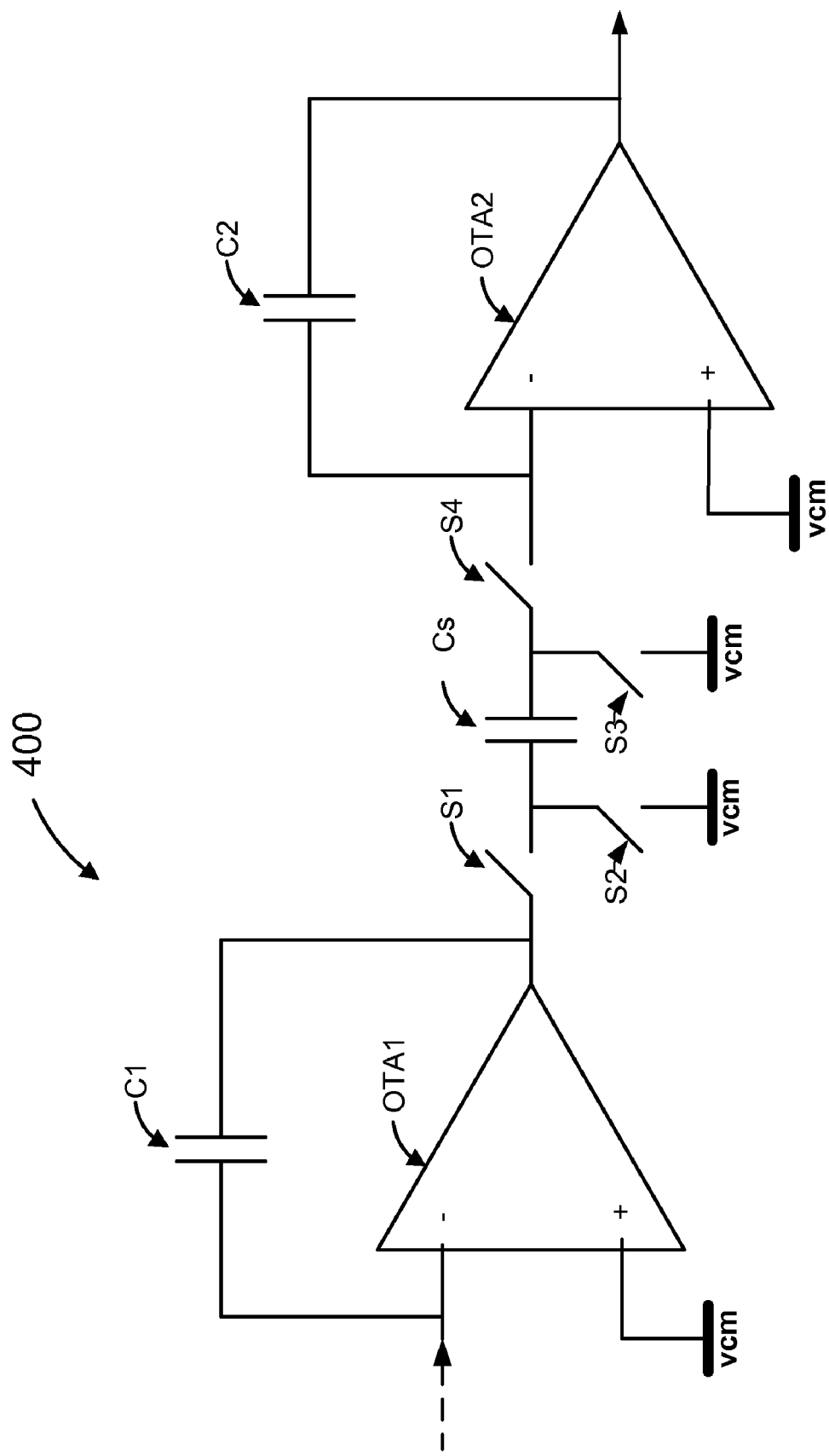
FIG. 4 shows selected elements of a switched capacitor network.
Figure 5:
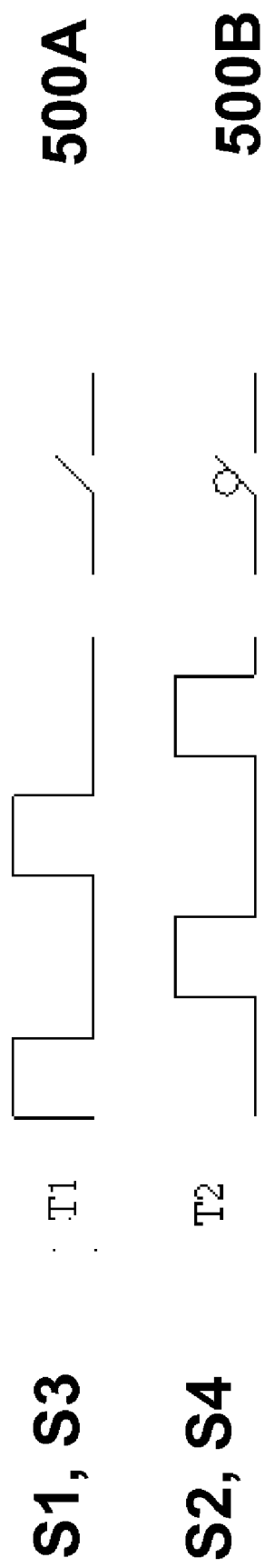
FIG. 5 shows timing charts 500A and 500B for clocks T1 and T2 controlling the states of the switches shown in FIG. 4.

FIG. 4 shows selected elements of a switched capacitor network 400 that can be implemented using a combination of IO and core devices, or using solely core devices. A single-ended network is shown for simplicity, but a balanced or fully differential version may be used in practice (with necessary changes) for better dynamic range and immunity to common-mode noise. In the network 400, OTA1 and OTA2 are operational transconductance amplifiers, and each of the switches S1-S4 may include a single NMOS transistor or a complementary pair of an NMOS transistor in parallel with a PMOS transistor. FIG. 5 shows timing charts 500A and 500B for clocks T1 and T2 controlling the states of the switches in FIG. 4. Clock T1 controls the switches S1 and S3 (the first set of switches) and clock T2 controls the switches S2 and S4 (the second set of switches). The timing pulses (or clock phases) controlling the two sets of switches may be non-overlapping or substantially non-overlapping; that is, when switches S1 and S3 are closed, switches S2 and S4 are open and vice versa. The timing pulses of the two sets of switches may be substantially symmetrical, that is, have duty cycles of about 50 percent. Various examples may be shown in which the switches may be implemented using NMOS transistors, PMOS transistors, and transmission gate (parallel NMOS/PMOS) transistors. The clocks T1 and T2 are connected to the gates of the transistor switches of their corresponding sets, gating them on/closed and off/open.

In operation, when S1 is closed, the output of OTA1 is electrically connected to S2 and to a first terminal of capacitor Cs. Conversely, when S1 is opened, the output of OTA1 is electrically disconnected from S2 and the first terminal of the capacitor Cs. When S2 is closed, the ground (or common mode) node is electrically connected to S1 and to the first terminal of the capacitor Cs. Conversely, when switch S2 is opened, ground is electrically disconnected from S1 and from the first terminal of the capacitor Cs. When S3 is closed, ground is electrically connected to S4 and to the second terminal of the capacitor Cs. Conversely, when switch S3 is opened, ground (or common mode voltage) is electrically disconnected from S4 and from the negative terminal of the capacitor Cs. When S4 is closed, S3 and the second terminal of the capacitor Cs are electrically connected to the inverting input of OTA2. Conversely, when S4 is opened, S3 and the second terminal of the capacitor Cs are disconnected from the inverting input of OTA2. During the input sample phase, that is, when the clock T1 is high, the capacitor Cs is charged to the OTA1 output voltage V1. During the charge transfer phase, that is, when the clock T2 is high, the charge stored in the capacitor Cs is transferred to the capacitor C2.

Note that bottom plate sampling (opening switch S3 slightly ahead of S1) may be used to prevent distortion due to charge injection.

Figure 6:
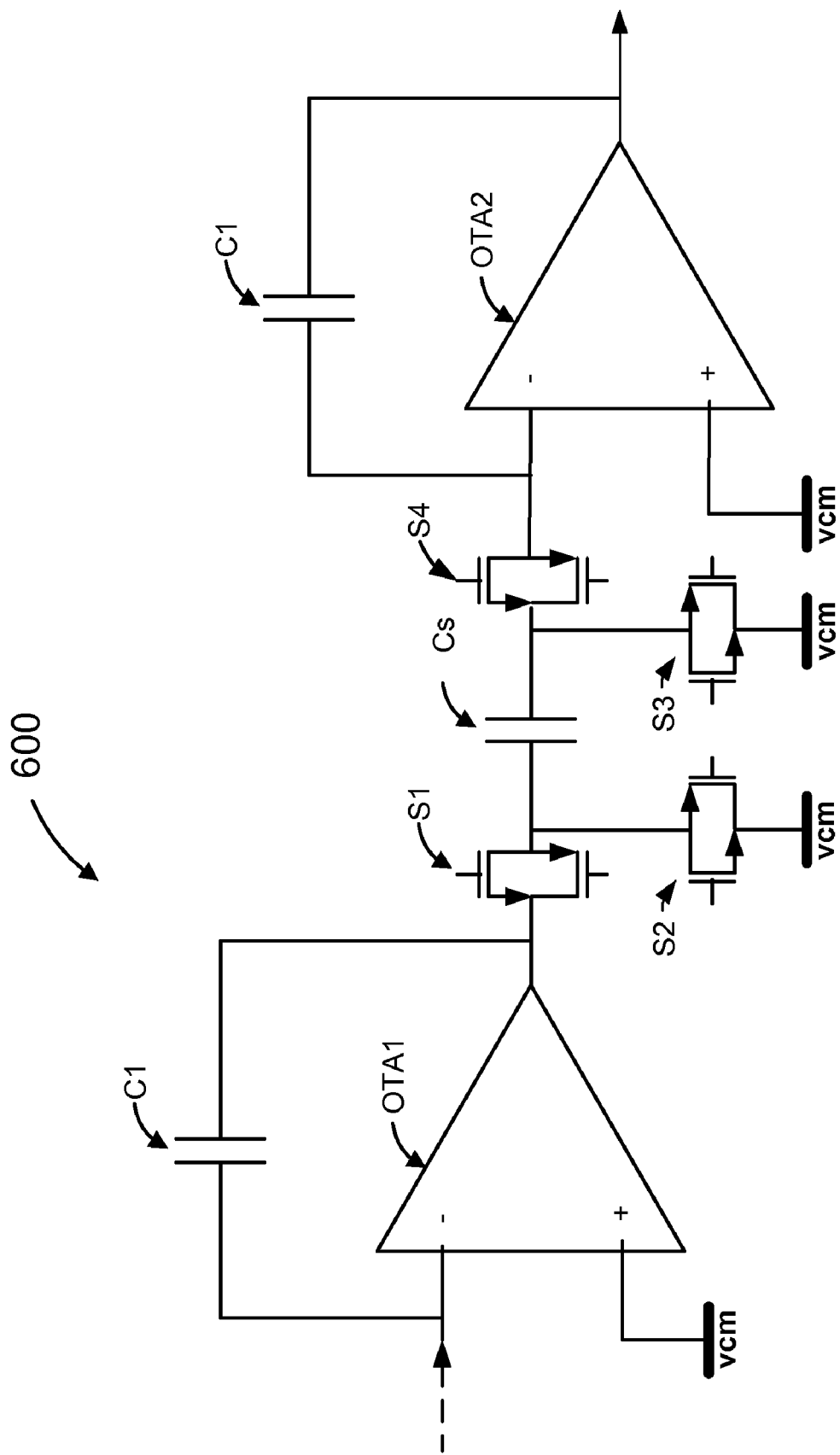
FIG. 6 is a block diagram illustrating selected elements of a variant of the switched capacitor network shown in FIG. 4.

FIG. 6 is a block diagram illustrating selected elements of a network 600. The network 600 is a variant of the network 400 in which the switches S1-S4 are made with all core transistors. The core transistors of the switches S1-S4 may operate at a lower supply voltage of 1.3 volts and be fabricated in 65 nm scale. Each of the switches S1-S4 may be implemented using complementary NMOS/PMOS core transistors. Each of the amplifiers OTA1 and OTA2 may also be built using all core devices and operate at (i.e., be powered by) a higher IO supply voltage of 2.1 volts, as is shown in FIG. 1 and/or FIG. 2.

Figure 7:
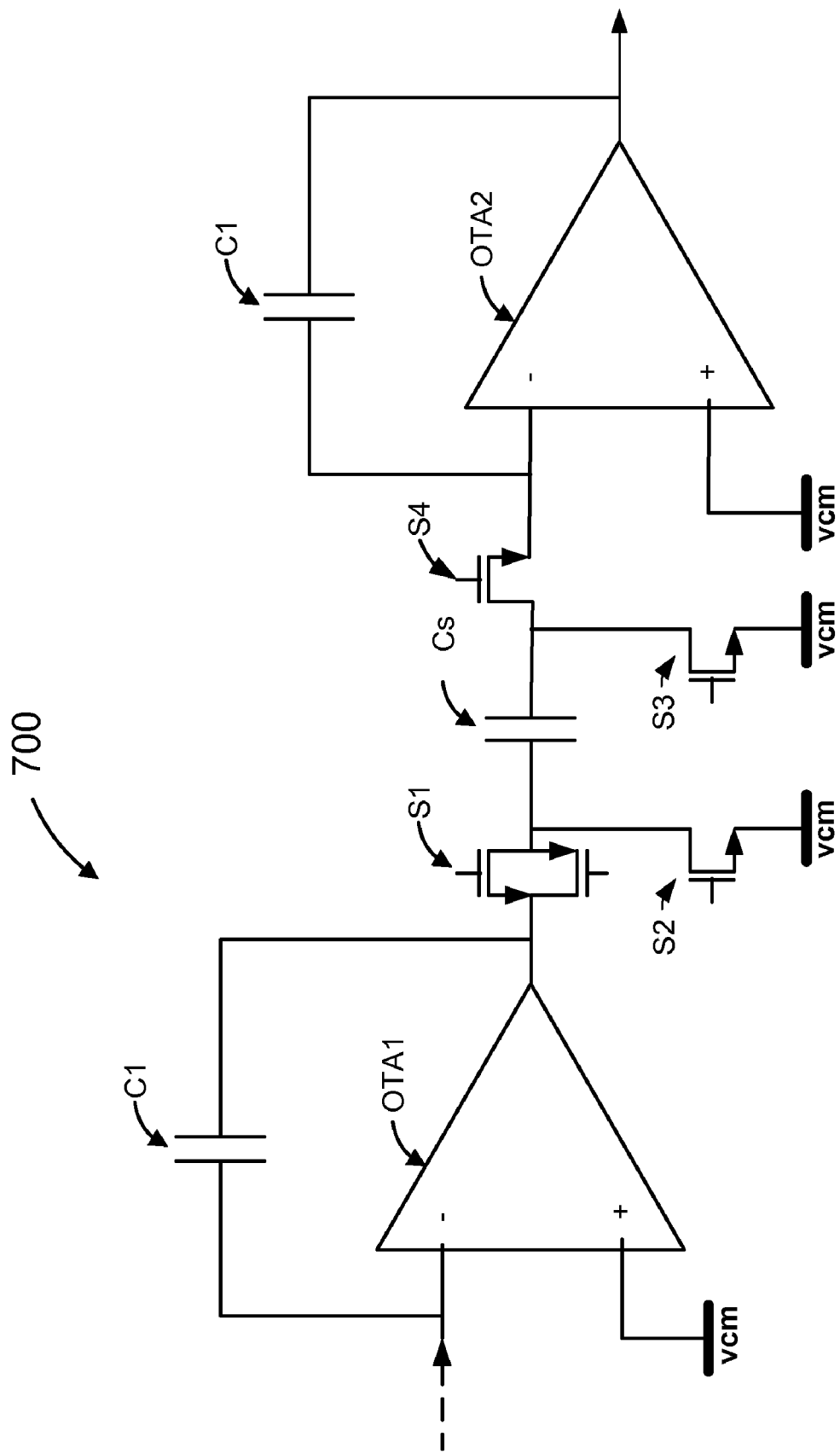
FIG. 7 is a block diagram illustrating selected elements of another variant of the switched capacitor network shown in FIG. 4.

FIG. 7 is a block diagram illustrating selected elements of another network 700. The network 700 is a variant of the network 400 in which the switches S1 and S2 are made using IO transistors, while the switches S3 and S4 are made with core transistors. The switch S1 is a complimentary NMOS/PMOS transistor pair; each of the switches S2-S4 includes an NMOS transistor. The switches S1 and S2 may be thick oxide transistor switches fabricated to a relatively high IO voltage reliability limit (e.g., 2.1 volts) in 65 nm scale; the S3 and S4 switches may be thin oxide switches fabricated to a relatively low core voltage reliability limit (e.g., 1.3 volts), also in 65 nm scale. Each of the operational transconductance amplifiers OTA1 and OTA2 may also be built using all core devices and operate at a higher IO supply voltage of 2.1 volts, as is shown in FIG. 1 and/or FIG. 2.

Figure 8:
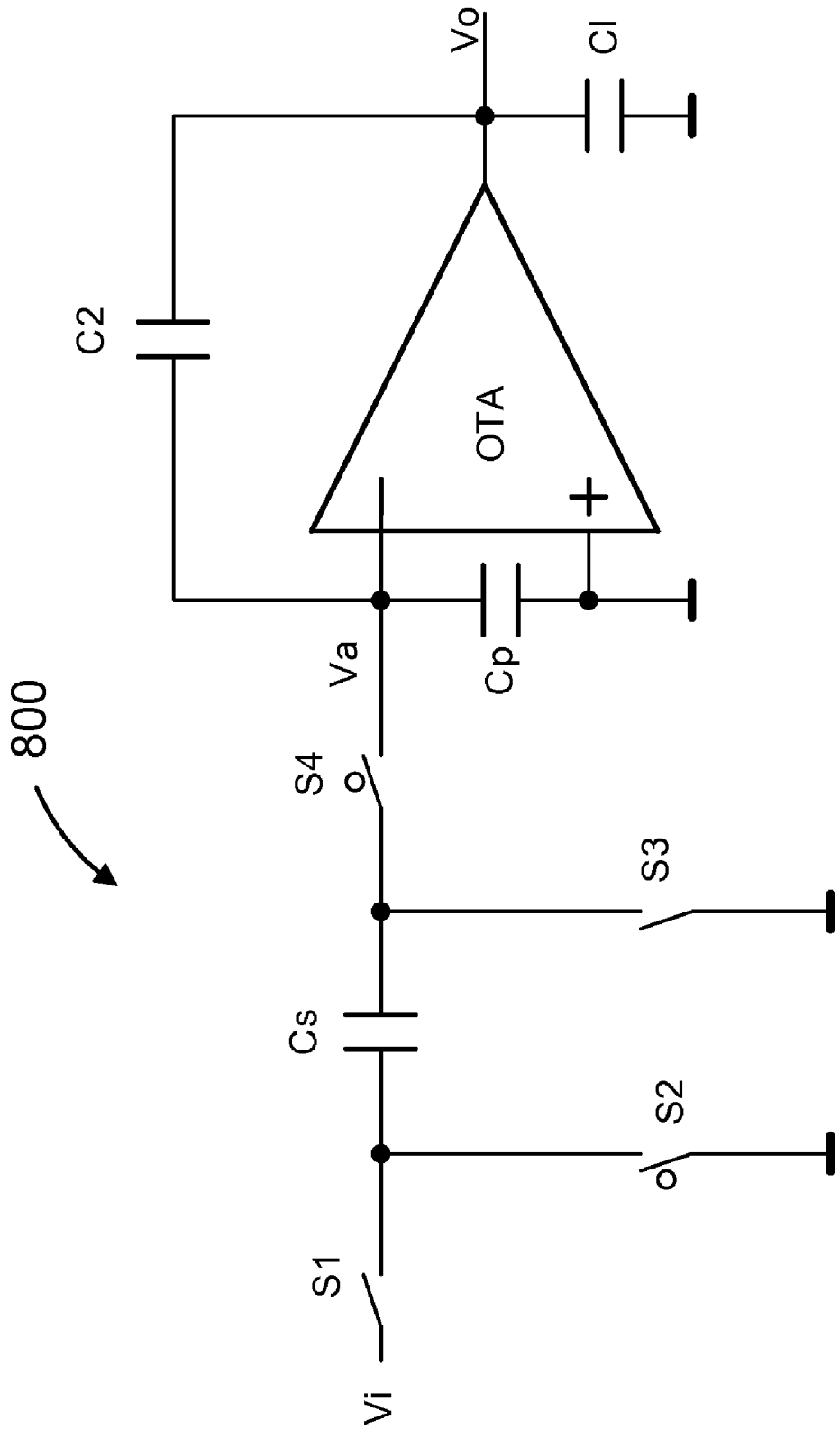
FIG. 8 shows selected elements of another switched capacitor integrator.

FIG. 8 shows selected elements of a non-inverting switched capacitor integrator 800 that can be implemented using a combination of IO and core devices, or using all core devices. In FIG. 8, Cs is an input sampling capacitor, C2 is an integration capacitor, and OTA is an operational transconductance amplifier. Cl and Cp represent, respectively, load capacitance and the OTA parasitic capacitance. The load capacitance Cl may include sampling capacitance from the following stage and all parasitic capacitances present at the output of the OTA. The integrator 800 may operate using two non-overlapping clock phases, such as the T1 and T2 clocks discussed above, the switches S1 and S3 being controlled by one clock, and the switches S2 and S4 being controlled by the other clock.

Figure 9:
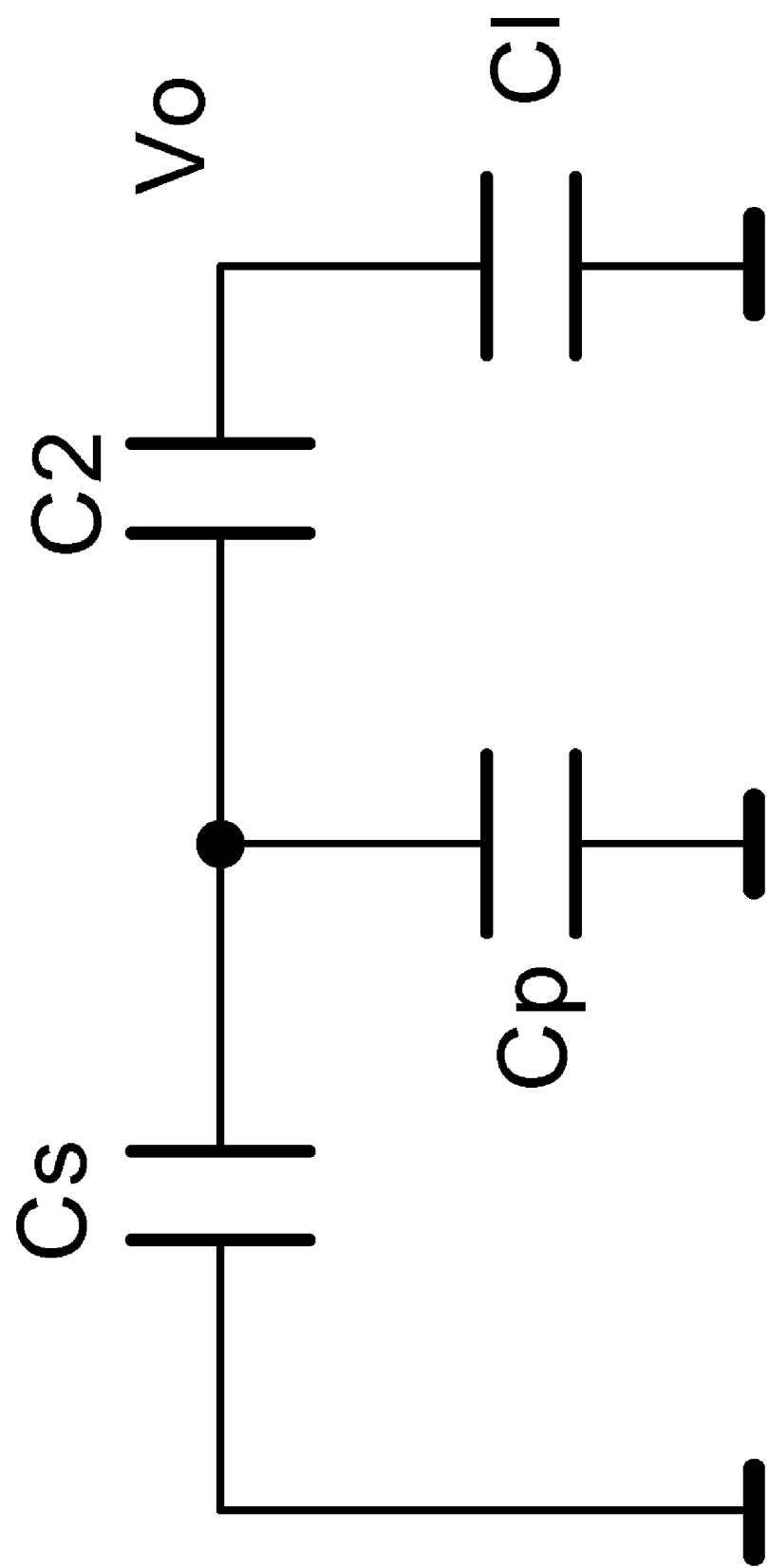
FIG. 9 shows a model of the integrator of FIG. 8.

Ignoring the switch turn-on resistance, when the first clock is ON, the integrator can be modeled as shown in FIG. 9. At the instant when S1 and S3 are opened and S2 and S4 are closed, no charge is available from the OTA to charge the capacitors. Initial voltage jump, based on charge conservation and assuming OTA gain, is then given by the following equation:

$$V_a = -V_i \times \frac{C_s}{C_s + C_p + \frac{C_2 \times C_l}{C_2 + C_l}}. \quad (8)$$

For typical switched capacitor filter and switched capacitor sigma-delta modulator applications, Cs and Cl are approximately the same size, C2 is normally much larger than both Cs and Cl, and Cp is around 10-20% of Cs. With the above typical values, we can see approximately a 0.5 Vi jump in Va at the instant when S2/S4 are closed. Assuming that the input Vi has a 1.5 volt peak-to-peak swing, with the input common mode voltage (analog ground) at 1.1 v (0.35 v–1.85 v), then we may see a maximum swing at Va of around +/−0.375 v. So the minimum and maximum voltages at Va are 1.1 v+/−0.375 v=0.725 v/1.475 v. With a power supply of 2.2 volts, this voltage swing at Va should not cause excessive stress to the transistors in the switches S3/S4, even if they are all thin oxide gate core NMOS devices. (For S3, the maximum of Vdg and Vds values is 1.475 volts; for S4, the maximum Vgs value is 2.2 v–0.725 v=1.475 v). Thus, voltage stress is reduced.

Figure 10:
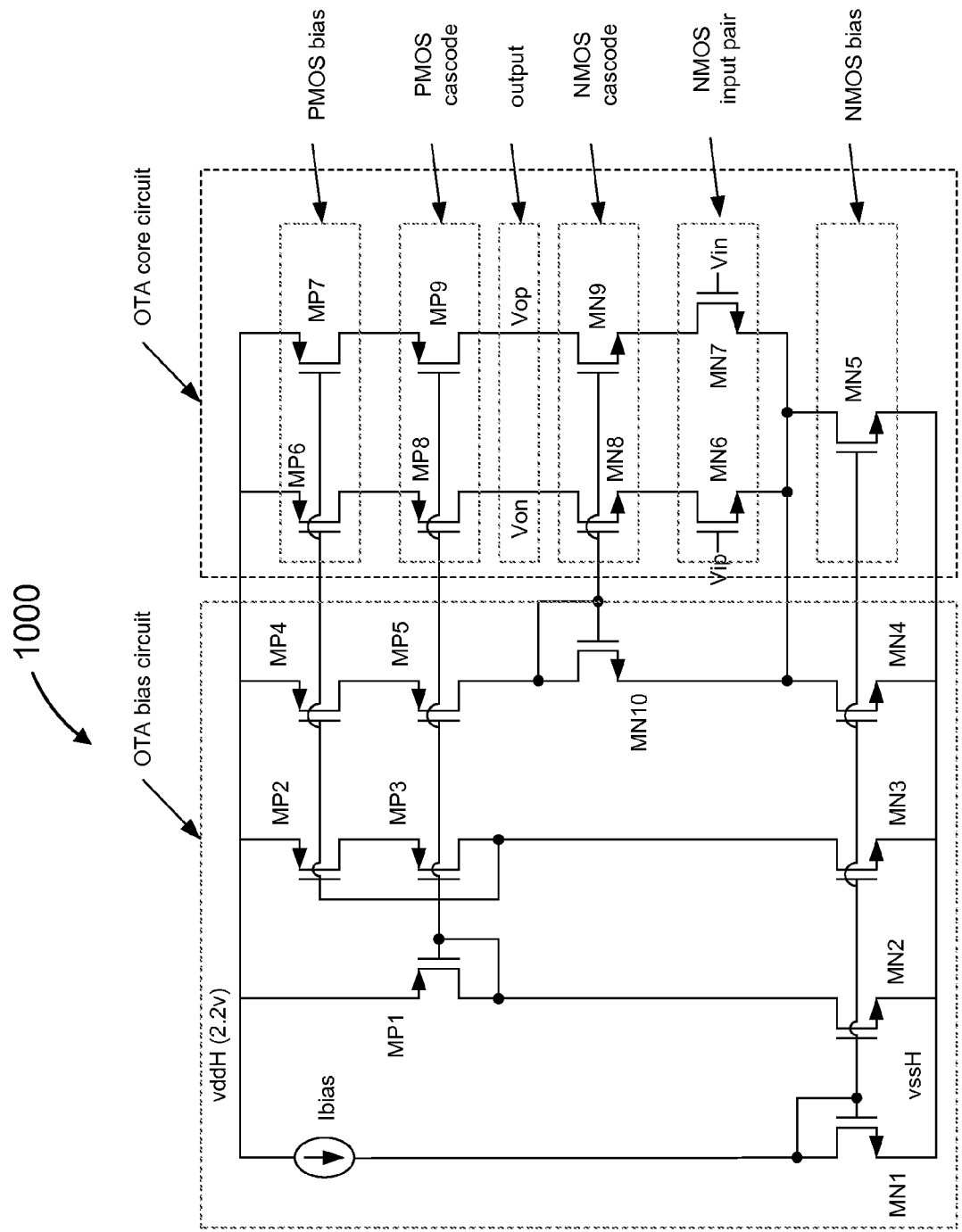
FIG. 10 illustrates selected elements of a single-stage telescopic operational transconductance amplifier.

We now turn to the problem of controlling transient voltages in a telescopic amplifier during turn-off of the amplifier. FIG. 10 illustrates selected elements of a single-stage telescopic operational transconductance amplifier 1000 made with core devices MP1-MP9 and MN1-MN10. The amplifier 1000 is powered by a high IO supply voltage vddH.

Figure 11:
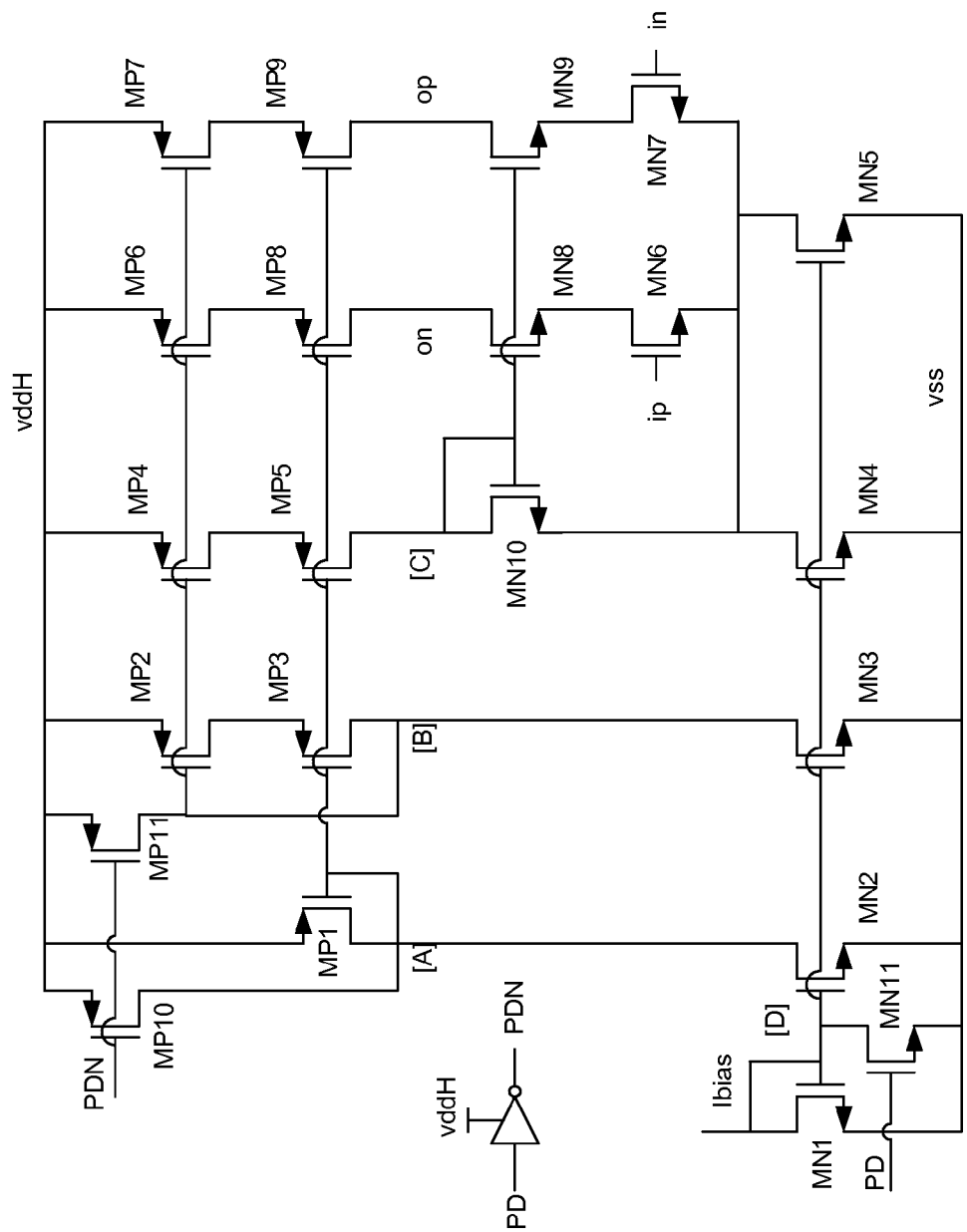
FIG. 11 illustrates an operational transconductance amplifier with controlled power down capability.

FIG. 11 illustrates an operational transconductance amplifier 1100 similar to the OTA 1000 with power down capability. To power down the OTA 1100, we first turn off the bias devices. In this case, when the power down signal PD is high, MN11 is turned on, which forces the gate voltages of MN1-MN5 low and shuts down these bottom bias devices. At the same time, PDN will be low, causing MP10 and MP11 to turn off bias transistors MP1-MP9. In this state, current will not flow between power supply (vddH) and ground (vss).

This power down method may create reliability problems when applied to a dual power supply design, where vddL (the core power supply voltage) is the process reliability limit, and vddH is the higher (IO) power supply voltage that powers the OTA; vddH exceeds the reliability limit of the core devices, but may be desirable for the reasons discussed above, for example, to increase the OTA output dynamic range.

There may be several reliability concerns in this case. First, the gates of the PMOS power down devices MP10, MP11 may not be pulled low to ground in the power down mode, because their gate-source voltage drops would then be as high as vddH, exceeding the vddL limit. Second, each of the nodes A (drain of MP1) and B (drain of MP3) may be forced to vddH in the power down mode, while node D (gate of MN2) may be forced to ground by power down device MN11; this may cause overstress and consequent reliability problems for MN2 and MN3, because of excessive gate to source voltage drops on these devices. Third, when both the top and bottom bias devices are turned off, node C (drain of MN10) and OTA outputs op and on will float, possibly stuck at a voltage close to vddH; this may cause overstress and consequent reliability problems for MN8 through MN10, as well as for any circuit connected to op and on at the top level.

Figure 12:
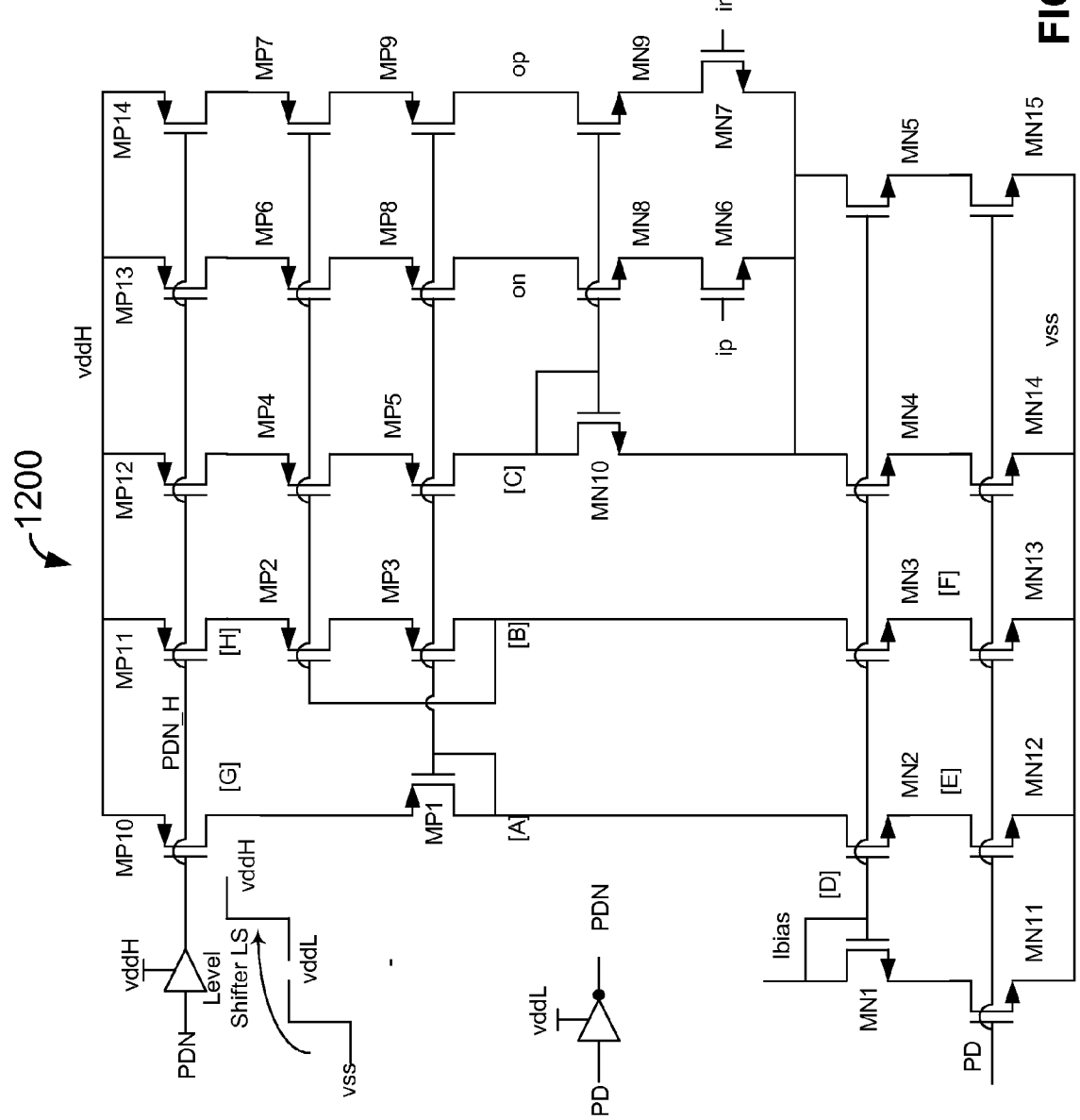
FIG. 12 illustrates an operational transconductance amplifier including a level shifter for the power down control signal.

FIG. 12 illustrates an operational transconductance amplifier 1200 similar to the OTA 1100, but also including a level shifter LS for the PDN signal, power down PMOS transistors MP12-MP14, and power down NMOS transistors MN12-MN14. The level shifter LS is configured to receive the PDN signal having the digital levels of (1) substantially vddL (high) and (2) substantially ground/vss (low); from these levels, the level shifter LS is configured to generate at its output corresponding PDN_H levels of (1) substantially vddH (high) and (2) some voltage above ground potential, for example, substantially vddL (low). When PDN is at the high level (such as vddL), the PMOS transistors MP12-MP14 isolate most of the circuitry of the OTA 1200 from vddH; and NMOS transistors MN12-MN14 isolate most of the circuitry of the OTA 1200 from vss.

With the output of the level shifter LS varying between vddH and vddL, the gate-source voltage drops for MP10 and MP11 in the power down mode are equal substantially to vddL, within the reliability limit of the core transistors.

In operation, the turn off sequence for the OTA 1200 includes first driving PD to low level so that the PDN signal goes high, and, after a period of time, powering down the vddH and vddL power supply voltages. The time period may be sufficiently long so as to substantially stabilize the transients caused by driving the PD signal low, and thereby avoid excessive voltage stresses on MN2, MN3, MN8 through MN10, as well as for circuits connected to op and on at the top level, as is discussed in relation to the OTA 1100 shown in FIG. 11.

Figure 13:
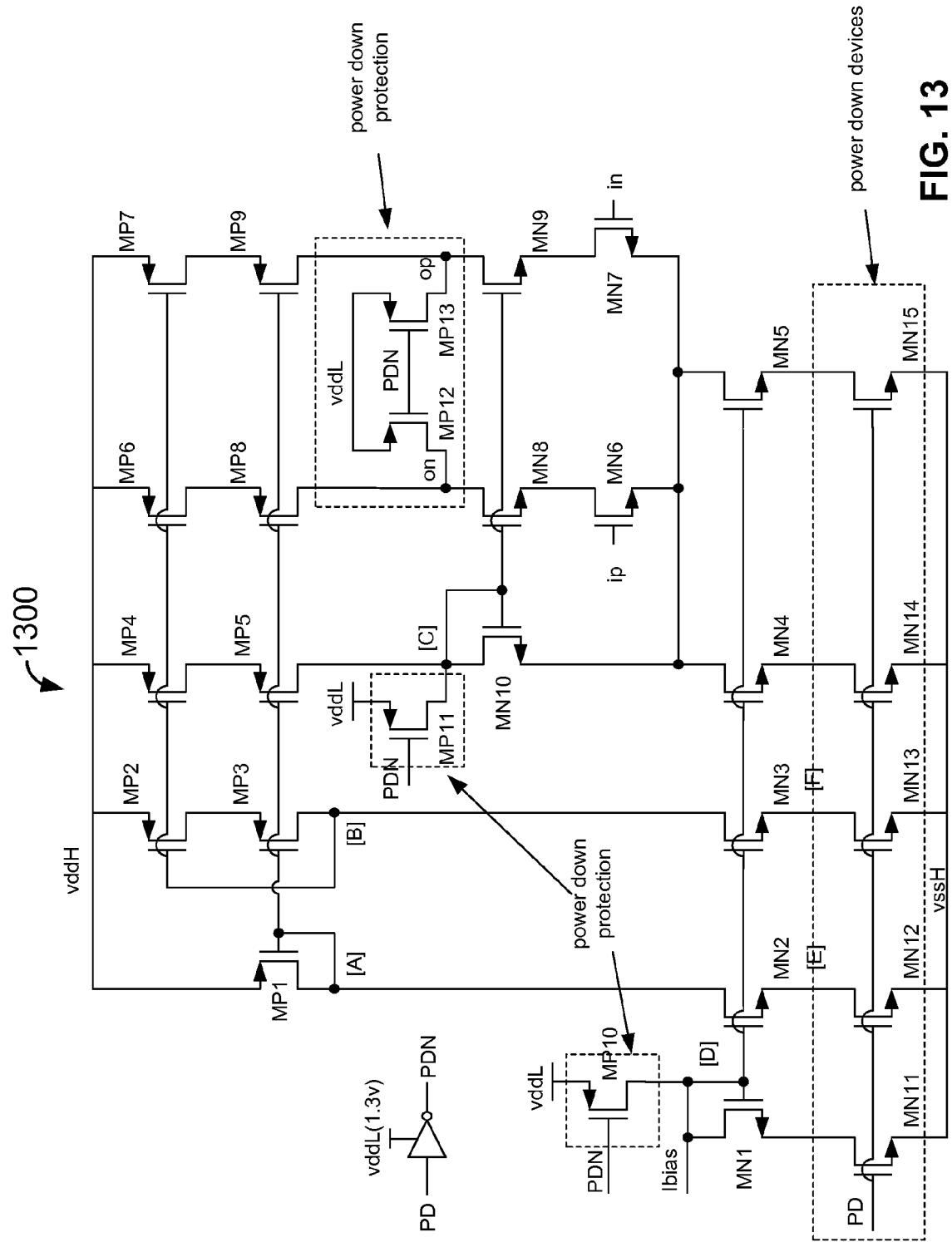
FIG. 13 illustrates an operational transconductance amplifier with additional protection during turn off.

FIG. 13 illustrates an operational transconductance amplifier 1300 similar to the OTA 1200, but with additional protection during turn off. The OTA 1300 includes power down NMOS transistors MN12-MN14 configured substantially in the same way as in the OTA 1200. The OTA 1300 also includes power down PMOS transistors MP10-MP13, but now configured differently, as is shown in FIG. 13. The source of each of the transistors MP10-MP13 is now tied to vddL. The OTA 1300 enables a simple yet effective power down method for protecting its individual devices from excessive voltage stress and thereby enhancing the devices' reliability. No level shifter is needed for power down control signals, because power down protection is implemented in the NMOS side only.

During normal operation of the OTA 1300 (i.e., not in power down), power down devices MN11-MN15 are all turned ON and power down protection devices MP10-MP13 are OFF. When power down is triggered (PD goes low), MN11-MN15 are turned OFF, which cuts all the current paths between vddH and vss. To protect other NMOS devices of the OTA 1300, transistors MP10-MP13 have been configured as shown in FIG. 13. During power down, internal node C (drain of MP11), internal node D (drain of MP10), positive output op, and negative output on are all forced to the vddL level; this prevents the nodes C and D and the outputs op and on from floating and drifting to ground or vddH. The NMOS devices of the OTA 1300 and other circuits connected to the outputs op and on are thus protected. The voltages at nodes A (gate and drain of MP1) and B (drain of MP3) may drift to the vddH in the power down mode, which effectively shuts down the top PMOS bias devices MP1-MP9. The drain-gate voltage drops for MN2 and MN3 are equal to about (vddH-vddL), which is below the reliability limit vddL for typical values (vddH of 2.1 and vddL of 1.3 volts). Nodes E (source of MN2) and F (source of MN3) are forced to one threshold voltage below vddL, automatically protecting the power down devices MN12-MN15. Therefore, all the transistors shown in FIG. 13 can be core devices, while the power supply vddH may be an IO power supply voltage. A resistive divider or a digital supply may be used to generate vddL from vddH.

In operation, the turn off sequence for the OTA 1300 includes first driving PD to low level so that the PDN signal goes high, and, after a period of time, powering down the vddH and vddL power supply voltages. The time period may be sufficiently long so as to substantially stabilize the transients due to the assertion of the PDN signal, and thereby avoid excessive voltage stresses on MN11-MN15 and MP10-MP13.

Variants of the OTA 1300 and the method for powering them down have a number of advantages, including simplicity of design, enhanced reliability, and flexibility of design. The power down circuit may use only the low power supply and control only the bottom NMOS devices. No level shifter may be needed. The power down devices MN11-MN15 and MP10-MP13 may be minimum channel length devices, with reduced cost of extra silicon. This design locks the internal node voltage in the power down mode to vddL, which solves the transient reliability issues during turn off. Additionally, as long as vddH is below 2 vddL, it can vary in a wide range, for example, between vddL and 2*vddL.

The circuits described in this document may be implemented on an integrated circuit (IC), radio frequency integrated circuit (RFIC), mixed-signal IC, an application specific integrated circuit (ASIC), printed circuit board (PCB), or on other electronic components. The various devices, including transistors, may be fabricated with various IC process technologies, such as complementary metal oxide semiconductor (CMOS), N-channel MOS, P-channel MOS, bipolar junction transistor (BJT), bipolar-CMOS (BiCMOS), silicon germanium (SiGe), and gallium arsenide (GaAs).

The CMOS circuit designs and methods described in this document may be employed in switched capacitor circuits, filters, amplifiers, and in other functional blocks. The functional blocks may be used in cellular communication apparatus, including access terminals and various parts of radio networks intended for communicating with access terminals.

Although steps and decisions of various methods may have been described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described above and/or shown in the accompanying Figures. Furthermore, not every illustrated step and decision may be required in every embodiment or variant, while some steps and decisions that have not been specifically illustrated may be desirable or necessary in some embodiments/variants.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. An operational amplifier comprising:
   a ground rail;
   a first supply rail configured to connect to a first power supply providing a first supply voltage between the first supply rail and the ground rail;
   a second supply rail configured to connect to a second power supply providing a second supply voltage between the second supply rail and the ground rail, the second supply voltage being less than the first supply voltage; and
   a plurality of metal-oxide-semiconductor transistors fabricated to a reliability voltage limit less than the first supply voltage;
   wherein:
   the plurality of transistors comprises a first P-channel transistor, a second P-channel transistor, a third P-channel transistor, a fourth P-channel transistor, a first N-channel transistor, a second N-channel transistor, a third N-channel transistor, and a fourth N-channel transistor, each transistor of the plurality of transistors comprising a source, a drain and a gate;
   the source of the first P-channel transistor is coupled to the first supply rail, the drain of the first P-channel transistor is coupled to the source of the second P-channel transistor, the drain of the second P-channel transistor is coupled to the drain of the first N-channel transistor, the source of the first N-channel transistor is coupled to the drain of the second N-channel transistor, and the source of the second N-channel transistor is coupled to the ground rail;
   the source of the third P-channel transistor is coupled to the first supply rail, the drain of the third P-channel transistor is coupled to the source of the fourth P-channel transistor, the drain of the fourth P-channel transistor is coupled to the drain of the third N-channel transistor, the source of the third N-channel transistor is coupled to the drain of the fourth N-channel transistor, and the source of the fourth N-channel transistor is coupled to the ground rail;
   the gates of the second P-channel transistor, the fourth P-channel transistor, the first N-channel transistor, and the third N-channel transistor are coupled to the second supply rail.

2. The operational amplifier of claim 1, wherein:
   the first supply voltage is between 2.1 and 2.3 volts; and
   the second supply voltage is between 1.2 and 1.4 volts.

3. The operational amplifier of claim 2, wherein the first supply rail is connected to the first power supply and the second supply rail is connected to the second power supply, so that the first supply voltage exists between the first supply rail and the ground rail, and so that the second supply voltage exists between the second supply rail and the ground rail.

4. The operational amplifier of claim 2, further comprising a first Miller capacitor and a second Miller capacitor, wherein:
   the plurality of transistors further comprises a fifth P-channel transistor, a sixth P-channel transistor, a fifth N-channel transistor, a sixth N-channel transistor, and a seventh N-channel transistor;
   the sources of the fifth P-channel transistor and the sixth P-channel transistor are coupled to the first supply rail, the gate of the fifth P-channel transistor is coupled to the gate of the sixth P-channel transistor, the drain of the fifth P-channel transistor is coupled to the drain of the fifth N-channel transistor, the drain of the sixth P-channel transistor is coupled to the drain of the sixth N-channel transistor, the sources of the fifth N-channel transistor and the sixth N-channel transistor are coupled to the drain of the seventh N-channel transistor, the gate of the seventh N-channel transistor is coupled to the gates of the second N-channel transistor and the fourth N-channel transistor, the gate of the first P-channel transistor is coupled to the drain of the sixth P-channel transistor, the gate of the third P-channel transistor is coupled to the drain of the fifth P-channel transistor, the first Miller capacitor is coupled between the gate of the third P-channel transistor and the drain of the fourth P-channel transistor, and the second Miller capacitor is coupled between the gate of the first P-channel transistor and the drain of the second P-channel transistor.

5. The operational amplifier of claim 4, wherein said each transistor of the plurality of transistors is a complimentary metal-oxide-semiconductor (CMOS) transistor and the reliability voltage limit is substantially the same as the second supply voltage.

6. The operational amplifier of claim 5, wherein said each transistor is fabricated in about 65 nanometer technology.

7. The operational amplifier of claim 1, wherein the first supply voltage is less than twice the second supply voltage.

8. A method of operating an operational amplifier, the method comprising:
   providing amplification and biasing core transistors fabricated to a predetermined reliability voltage limit;

providing a power supply voltage to the amplification and biasing core transistors, the power supply voltage exceeding the predetermined reliability voltage limit;

providing a biasing voltage to gates of at least two of the amplification and biasing core transistors, the biasing voltage not exceeding the predetermined reliability voltage limit.

9. The method of claim 8, wherein the predetermined reliability voltage limit is between 1.1 and 1.3 volts, and the power supply voltage is between 2.1 and 2.3 volts.

10. An operational transconductance amplifier comprising:
a ground rail;
a first supply rail configured to connect to a first power supply providing a first supply voltage between the first supply rail and the ground rail;
a second supply rail configured to connect to a second power supply providing a second supply voltage between the second supply rail and the ground rail, the second supply voltage being less than the first supply voltage;
an input stage;
an output stage coupled to the input stage, the output stage comprising a first side and a second side, the first side comprising a first amplification transistor, a first bias transistor, and a first plurality of protection transistors, the second side comprising a second amplification transistor, a second bias transistor, and a second plurality of protection transistors, each transistor of said first amplification transistor, first bias transistor, first plurality of protection transistors, second amplification transistor, second bias transistor, and second plurality of protection transistors comprising a drain, a gate, and a source;
wherein:
the transistors of the first side are connected in series between the first supply rail and the ground rail;
the transistors of the second side are connected in series between the first supply rail and the ground rail;
the transistors of the first side are fabricated to a reliability voltage limit less than the first supply voltage;
the transistors of the second side are fabricated to the reliability voltage limit; and
the gates of the first and second pluralities of protection transistors are coupled to the second supply rail.

11. The operational amplifier of claim 10, wherein:
the first supply voltage is between 2.1 and 2.3 volts; and
the second supply voltage is between 1.2 and 1.4 volts.

12. The operational amplifier of claim 10, wherein
the first supply voltage is less than twice the second supply voltage.

13. An operational amplifier, comprising:
amplification and biasing core transistors fabricated to a predetermined reliability voltage limit;
means for providing a power supply voltage to the amplification and biasing core transistors, wherein the provided power supply voltage exceeds the predetermined reliability voltage limit; and
means for providing a biasing voltage to gates of at least two of the amplification and biasing core transistors, wherein the biasing voltage does not exceed the predetermined reliability voltage limit.

14. The operational amplifier of claim 13, wherein the predetermined reliability voltage limit is between 1.1 and 1.3 volts, and the power supply voltage is between 2.1 and 2.3 volts.

15. An operational amplifier, comprising:
amplification and biasing core transistors fabricated to a predetermined reliability voltage limit;
a processor; and
a memory coupled to the processor, wherein the processor is configured with software instructions to perform steps comprising:
providing a power supply voltage to the amplification and biasing core transistors, wherein the provided power supply voltage exceeds the predetermined reliability voltage limit; and
providing a biasing voltage to gates of at least two of the amplification and biasing core transistors, wherein the biasing voltage does not exceed the predetermined reliability voltage limit.

16. The operational amplifier of claim 15, wherein the predetermined reliability voltage limit is between 1.1 and 1.3 volts, and the power supply voltage is between 2.1 and 2.3 volts.

17. A tangible storage medium having stored thereon processor-executable software instructions configured to cause a mobile device processor to perform steps comprising:
providing a power supply voltage to amplification and biasing core transistors, wherein the provided power supply voltage exceeds the predetermined reliability voltage limit;
providing a biasing voltage to gates of at least two of the amplification and biasing core transistors, wherein the biasing voltage does not exceed the predetermined reliability voltage limit.

18. The tangible storage medium of claim 17, wherein the predetermined reliability voltage limit is between 1.1 and 1.3 volts, and the power supply voltage is between 2.1 and 2.3 volts.

* * * * *